US007952553B2

(12) United States Patent
Yoon-Kyung

(10) Patent No.: US 7,952,553 B2
(45) Date of Patent: *May 31, 2011

(54) AMPLIFIER CIRCUITS IN WHICH COMPENSATION CAPACITORS CAN BE CROSS-CONNECTED SO THAT THE VOLTAGE LEVEL AT AN OUTPUT NODE CAN BE RESET TO ABOUT ONE-HALF A DIFFERENCE BETWEEN A POWER VOLTAGE LEVEL AND A COMMON REFERENCE VOLTAGE LEVEL AND METHODS OF OPERATING THE SAME

(75) Inventor: Choi Yoon-Kyung, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1248 days.

This patent is subject to a terminal disclaimer.

(21) Appl. No.: 11/589,353

(22) Filed: Oct. 30, 2006

(65) Prior Publication Data

US 2007/0285412 A1 Dec. 13, 2007

(30) Foreign Application Priority Data

Jun. 12, 2006 (KR) ........................ 10-2006-0052397

(51) Int. Cl.
*G09G 3/36* (2006.01)
*H03F 3/45* (2006.01)

(52) U.S. Cl. ........................................ 345/100; 330/252

(58) Field of Classification Search ............ 345/98–100, 345/211–213; 330/255, 292
See application file for complete search history.

(56) References Cited

U.S. PATENT DOCUMENTS

| | | | | |
|---|---|---|---|---|
| 7,652,538 | B2 * | 1/2010 | Choi | 330/292 |
| 7,760,199 | B2 * | 7/2010 | An | 345/204 |
| 2006/0091955 | A1 | 5/2006 | Choi | |
| 2006/0125759 | A1 | 6/2006 | An | |
| 2006/0279356 | A1 | 12/2006 | An | |

FOREIGN PATENT DOCUMENTS

| | | |
|---|---|---|
| JP | 2006-094534 | 4/2006 |
| KR | 10-2002-0063733 A | 8/2002 |
| KR | 10-2005-0080234 A | 8/2005 |
| KR | 10-2006-0028119 A | 3/2006 |
| KR | 10-2006-0064941 A | 6/2006 |
| KR | 10-2006-0124432 A | 12/2006 |

* cited by examiner

*Primary Examiner* — Bipin Shalwala
*Assistant Examiner* — Steven E Holton
(74) *Attorney, Agent, or Firm* — Myers Bigel Sibley & Sajovec, P.A.

(57) ABSTRACT

A circuit includes an amplifier circuit that is configured to generate voltage levels between a power voltage level and a common reference voltage level at an output thereof responsive to image data. A reset control circuit is configured to reset the voltage level at the output of the amplifier circuit to about one-half of a difference between the power voltage level and the common reference voltage level.

25 Claims, 8 Drawing Sheets

300

AMPLIFIER CIRCUITS IN WHICH COMPENSATION CAPACITORS CAN BE CROSS-CONNECTED SO THAT THE VOLTAGE LEVEL AT AN OUTPUT NODE CAN BE RESET TO ABOUT ONE-HALF A DIFFERENCE BETWEEN A POWER VOLTAGE LEVEL AND A COMMON REFERENCE VOLTAGE LEVEL AND METHODS OF OPERATING THE SAME

RELATED APPLICATION

This application claims the benefit of and priority to Korean Patent Application No. P2006-0052397, filed Jun. 12, 2006, in the Korean Intellectual Property Office, the disclosure of which is hereby incorporated herein by reference as if set forth in its entirety.

FIELD OF THE INVENTION

The present invention relates generally to integrated circuit devices and methods of operating the same and, more particularly, to amplifier circuits for a display device and methods of operating the same.

BACKGROUND OF THE INVENTION

As the resolution of mobile devices increases, source amplifiers in the source driver may need to drive display panels faster. In addition to increased speed, however, it is also desirable to maintain relatively low power consumption to conserve battery life in devices, such as mobile phones, personal digital assistants, and the like. For example, the bias current of a typical mobile Liquid Crystal Display Integrated Circuit (LDI) source driver amplifier is less than 1 μA. However, there may be hundreds of source driver amplifiers in an LDI so even relatively small increases in the bias current of a source driver amplifier may significantly shorten battery life.

FIG. 1 illustrates a conventional source driver amplifier circuit that is configured as a unity-gain buffer in which the output node VOUT is connected to the negative input node inn. FIGS. 2A and 2B illustrate plots of an input voltage waveform applied to the amplifier of FIG. 1 and the output voltage waveform generated in response to the input voltage waveform, respectively. The input voltage waveform changes at the beginning of a new row-line scan as shown in FIG. 2A. The source driver amplifier drives the column line of the display panel in response to the input voltage waveform. As shown in FIG. 2B, the driving time for generating the output voltage waveform is influenced primarily by the slew rate of the source driver amplifier. The slew rate (SR) may be expressed as follows: $SR=I_b/C_m$, where $I_b$ is the tail current of the input differential stage and $C_m$ is the capacitance of the compensation capacitors. The source driver amplifier circuit of FIG. 1 includes two compensation capacitors. $C_P$ and $C_N$. Because the bias current of a conventional source driver amplifier is relatively small, the dominant factor that limits the driving time of the amplifier is the speed at which the compensation capacitors can be charged and discharged.

SUMMARY

According to some embodiments of the present invention, a circuit includes an amplifier circuit that is configured to generate voltage levels between a power voltage level and a common reference voltage level at an output thereof responsive to image data. A reset control circuit is configured to reset the voltage level at the output of the amplifier circuit to about one-half of a difference between the power voltage level and the common reference voltage level.

In other embodiments of the present invention, the amplifier circuit comprises first and second compensation capacitors connected in series between a power node that provides the power voltage level and a common reference node that provides the common reference voltage level.

In still other embodiments of the present invention, the reset control circuit is further configured to disconnect the first and second compensation capacitors from the power node and the common reference node and to connect the first and second compensation capacitors in parallel responsive to a control signal.

In still other embodiments of the present invention, the amplifier circuit further comprises an output stage circuit having an output node, wherein the first compensation capacitor is connected between the output node and the power node and the second compensation capacitor is connected between the output node and the common reference node.

In still other embodiments of the present invention, the output stage circuit is a class AB amplifier output stage circuit.

In still other embodiments of the present invention, the amplifier circuit further comprises a first current mirror circuit that is connected between the power node and the first compensation capacitor and a second current mirror circuit that is connected between the common reference node and the second compensation capacitor.

In still other embodiments of the present invention, the reset control circuit comprises a first switch that is configured to disconnect the first current mirror circuit from the first compensation capacitor responsive to the control signal, a second switch that is configured to disconnect the second current mirror circuit from the second compensation capacitor responsive to the control signal, a third switch that is configured to disconnect the output node of the output stage circuit from the first compensation capacitor responsive to the control signal, a fourth switch that is configured to disconnect the output node of the output stage circuit from the second compensation capacitor responsive to the control signal, and a pair of cross-connect switches that are configured to connect the first and second compensation capacitors in parallel responsive to the control signal.

In still other embodiments of the present invention, the amplifier circuit further comprises a differential amplifier circuit that is connected to the first and second current mirror circuits and is responsive to a differential input voltage.

In still other embodiments of the present invention, the differential amplifier circuit has an input terminal that is connected to the output node of the output stage circuit.

In still other embodiments of the present invention, the reset control circuit is further configured to disconnect the output node of the output stage circuit from the input terminal of the differential amplifier circuit responsive to the control signal.

In still other embodiments of the present invention, the differential amplifier circuit comprises a PMOS differential amplifier circuit that is connected to the first current mirror circuit and an NMOS differential amplifier circuit that is connected to the second current mirror circuit.

In still other embodiments of the present invention, the amplifier circuit further comprises an output stage control circuit that is connected between the output stage circuit and the first and second current mirror circuits.

In still other embodiments of the present invention, the amplifier circuit further comprises a floating current source circuit that is connected between the first and second current mirror circuits.

In further embodiments of the present invention, a driver system for an electronic display includes a display panel comprising an array of pixels and an image data driver circuit. The image data driver circuit includes an amplifier circuit that is configured to drive the display panel with voltage levels between a power voltage level and a common reference voltage level at outputs thereof responsive to image data and a reset control circuit that is configured to reset the voltage levels at the outputs of the amplifier circuit to about one-half of a difference between the power voltage level and the common reference voltage level.

In still further embodiments of the present invention, the amplifier circuit comprises a plurality of amplifier circuits. The amplifier circuits are respectively associated with pixels along a first dimension of the array. Each of the amplifier circuits comprise first and second compensation capacitors connected in series between a power node that provides the power voltage level and a common reference node that provides the common reference voltage level.

In still further embodiments of the present invention, the reset control circuit is further configured to disconnect the first and second compensation capacitors from the power node and the common reference node and to connect the first and second compensation capacitors in parallel responsive to a control signal.

In still further embodiments of the present invention, a control circuit is configured to generate the control signal, and a gate driver control signal in concert with one another and to output image data. A gate driver circuit is connected to the display panel and is configured to selectively scan the pixels along a second dimension of the array responsive to the gate driver control signal.

In still further embodiments of the present invention, the control circuit is further configured to generate a source driver control signal. The image data driver circuit further comprises a digital-to-analog converter that is configured to generate gray-scale analog voltage levels responsive to the image data, wherein the plurality of amplifier circuits are configured to selectively drive pixels along the first dimension of the array with the gray-scale voltage levels responsive to the source driver control signal.

In still further embodiments of the present invention, the image data driver circuit comprises a bias circuit connected to the plurality of amplifier circuits.

In still further embodiments of the present invention, each of the amplifier circuits further comprises an output stage circuit having an output node, wherein the first compensation capacitor is connected between the output node and the power node and the second compensation capacitor is connected between the output node and the common reference node.

In still further embodiments of the present invention, the output stage circuit is a class AB amplifier output stage circuit.

In still further embodiments of the present invention, each of the amplifier circuits further comprises a first current mirror circuit that is connected between the power node and the first compensation capacitor and a second current mirror circuit that is connected between the common reference node and the second compensation capacitor.

In still further embodiments of the present invention, the reset control circuit comprises a first switch that is configured to disconnect the first current mirror circuit from the first compensation capacitor responsive to the control signal, a second switch that is configured to disconnect the second current mirror circuit from the second compensation capacitor responsive to the control signals a third switch that is configured to disconnect the output node of the output stage circuit from the first compensation capacitor responsive to the control signal, a fourth switch that is configured to disconnect the output node of the output stage circuit from the second compensation capacitor responsive to the control signal, and a pair of cross-connect switches that are configured to connect the first and second compensation capacitors in parallel responsive to a control signal.

In still further embodiments of the present invention, each of the amplifier circuits further comprises a differential amplifier circuit that is connected to the first and second current mirror circuits and is responsive to a differential input voltage.

In still further embodiments of the present invention, the differential amplifier circuit has an input terminal that is connected to the output node of the output stage circuit.

In still further embodiments of the present invention, the reset control circuit is further configured to disconnect the output node of the output stage circuit from the input terminal of the differential amplifier circuit responsive to the control signal.

In still further embodiments of the present invention, the differential amplifier circuit comprises a PMOS differential amplifier circuit that is connected to the first current mirror circuit and an NMOS differential amplifier circuit that is connected to the second current mirror circuit.

In still further embodiments of the present invention, each of the amplifier circuits further comprises an output stage control circuit that is connected between the output stage circuit and the first and second current mirror circuits.

In still further embodiments of the present invention, each of the amplifier circuits further comprises a floating current source circuit that is connected between the first and second current mirror circuits.

Although described above primarily with respect to circuit and/or driver system embodiments of the present invention, it will be understood that the present invention can be embodied as a circuit, system, and/or method.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF EMBODIMENTS

Figure 1:
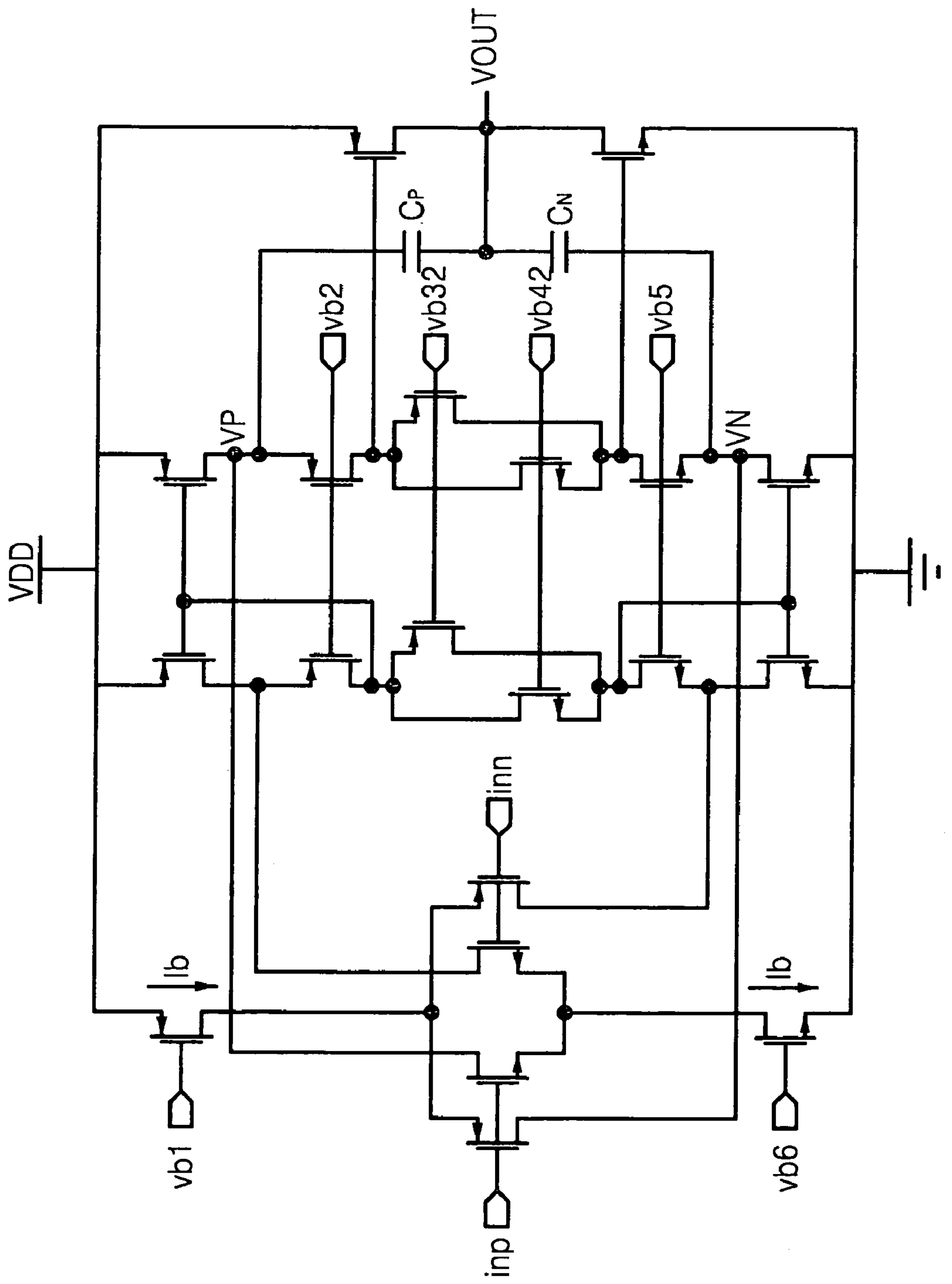
FIG. 1 (PRIOR ART)
FIG. 1 is a schematic that illustrates a conventional source driver amplifier circuit.
Figure 2A:
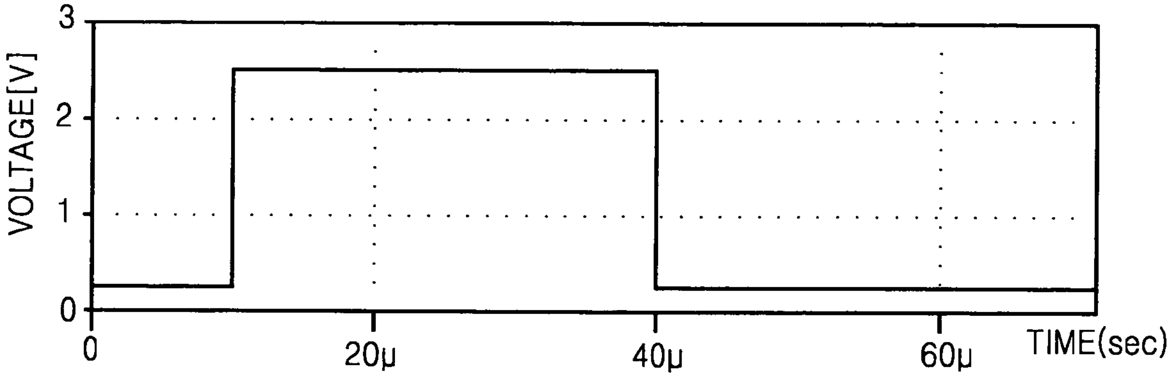
FIG. 2A(PRIOR ART)
FIGS. 2A and 2B illustrate plots of an input voltage waveform applied to the amplifier of FIG. 1 and the output voltage waveform generated in response to the input voltage waveform, respectively.
Figure 2B:
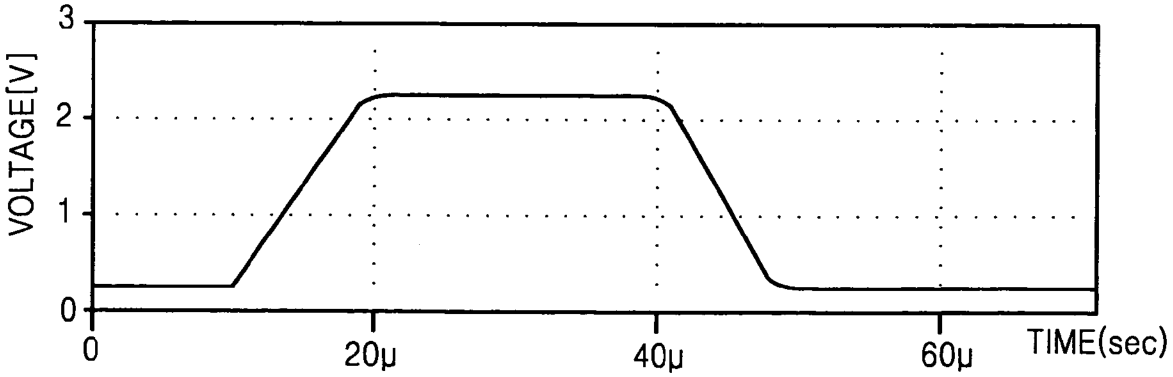
FIG. 2B(PRIOR ART)

While the present invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims.

It will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements. As used herein, the term "and/or" and "/" includes any and all combinations of one or more of the associated listed items. Like numbers refer to like elements throughout the description.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that although the terms first and second are used herein to describe various components, circuits, regions, layers and/or sections, these components, circuits, regions, layers and/or sections should not be limited by these terms. These terms are only used to distinguish one component, circuit, region, layer or section from another component, circuit, region, layer or section. Thus, a first component, circuit, region, layer or section discussed below could be termed a second component, circuit, region, layer or section, and similarly, a second component, circuit, region, layer or section may be termed a first component, circuit, region, layer or section without departing from the teachings of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Some embodiments of the present invention stem from a realization that because the bias current of a conventional source driver amplifier is relatively small, the dominant factor that limits the driving time of the amplifier is the speed at which the compensation capacitors can be charged and discharged. According to some embodiments of the present invention, the output of an amplifier circuit can be driven to half-VDD relatively quickly through charge-sharing before the amplifier is driven to a new voltage. Advantageously, according to some embodiments of the present invention, the output of the amplifier circuit can be driven to half-VDD through charge sharing instead of by current, which allows the amplifier's power consumption to be reduced.

Figure 3:
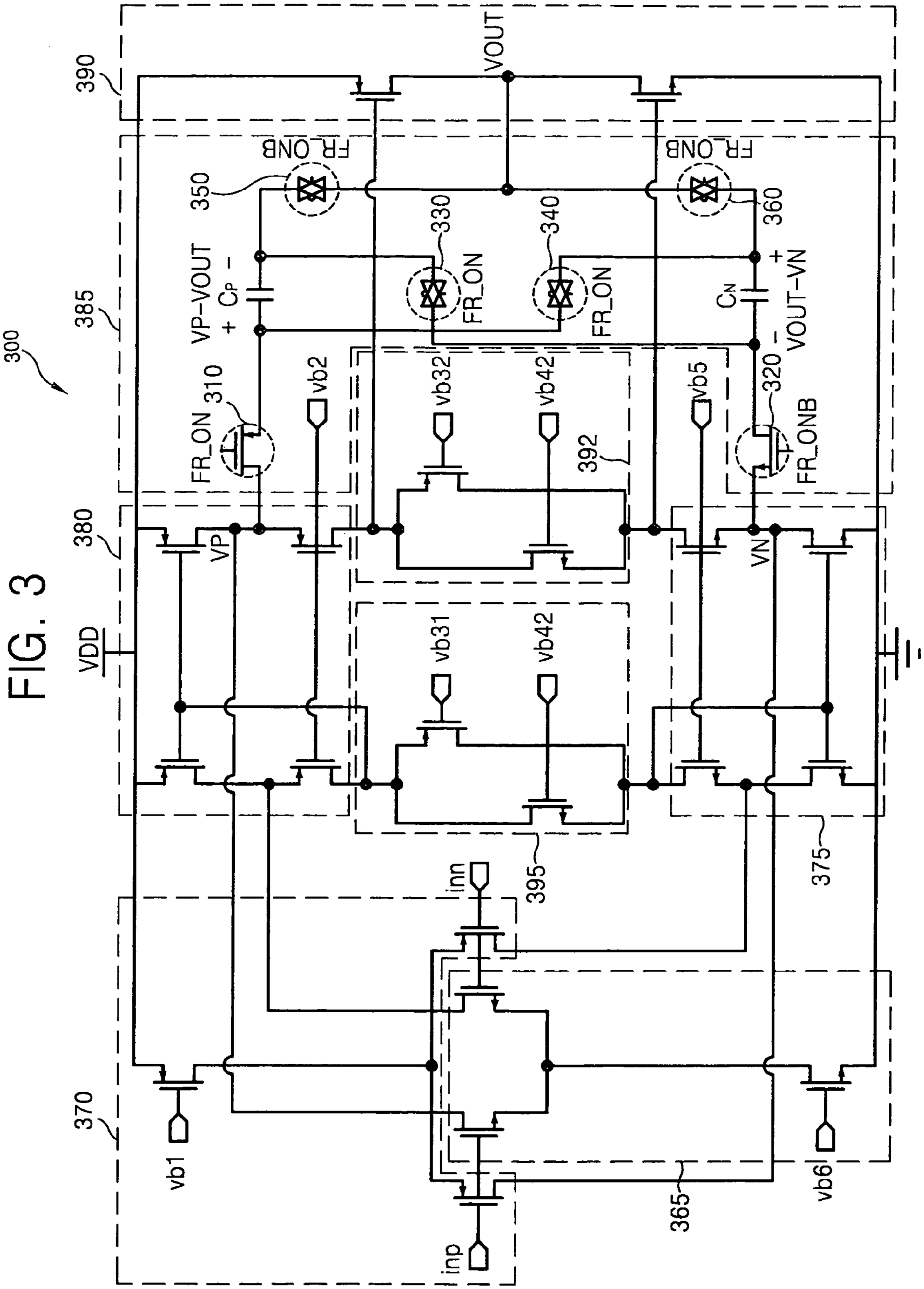
FIG. 3 is a schematic that illustrates a circuit that includes an amplifier circuit and a reset control circuit, according to some embodiments of the present invention.

Referring to FIG. 3, a circuit 300 that includes an amplifier circuit and a reset control circuit, according to some embodiments of the present invention, is illustrated. The reset control circuit includes six switches 310, 320, 330, 340, 350, and 360 that are configured as shown. The switches 310, 320, 330, 340, 350, and 360 are operable to connect and disconnect the compensation capacitors $C_P$ and $C_N$ from the remainder of the circuit 300 to facilitate charge-sharing between the compensation capacitors $C_P$ and $C_N$ responsive to a control signal (FR_ON). When the switches 310, 320, 350, and 360 are closed and switches 330 and 340 are open, the compensation capacitors $C_P$ and $C_N$ are connected in series between a power node that provides a power voltage level VDD and a common reference node, e.g., ground, that provides a common reference voltage level.

Figure 4:
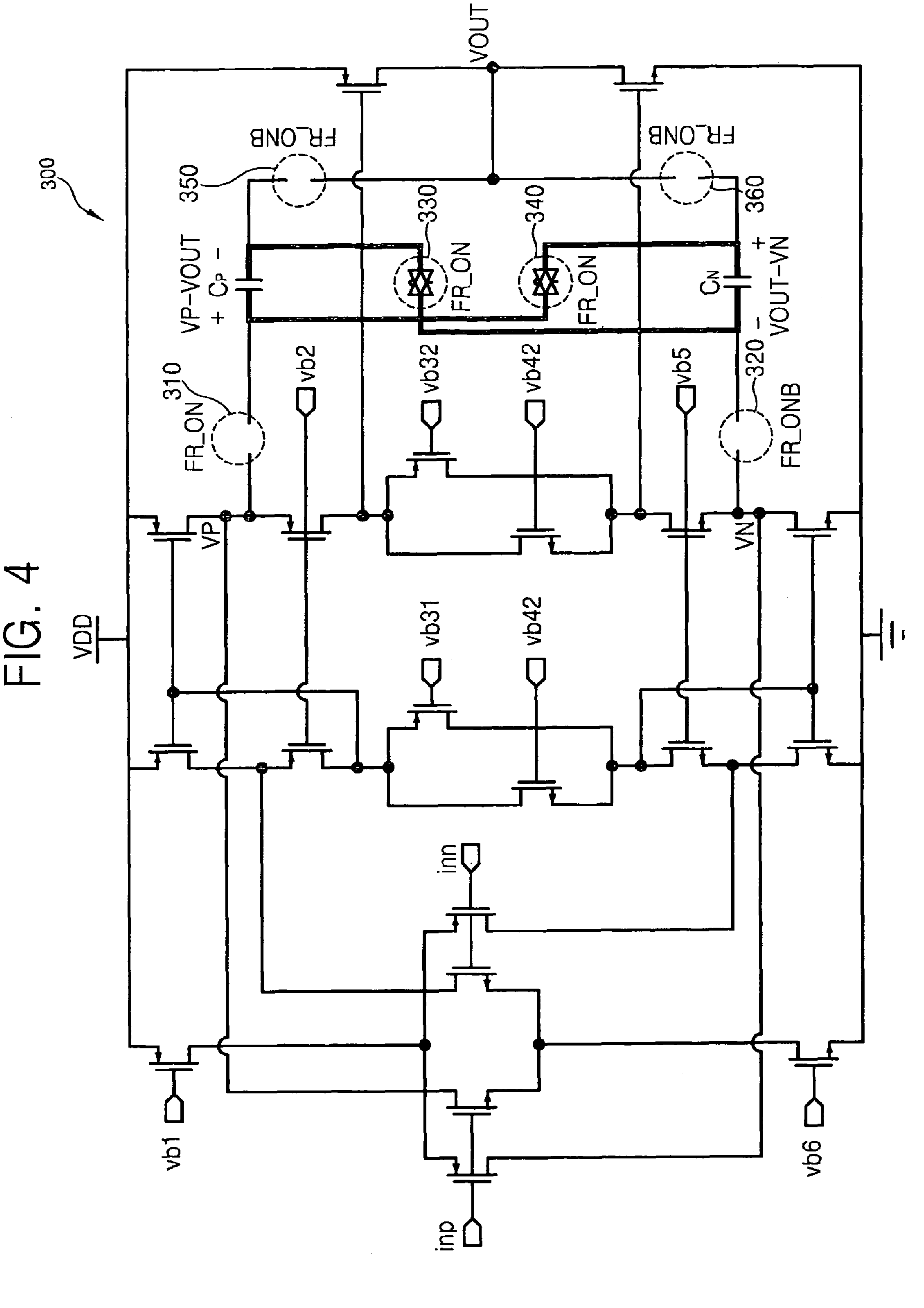
FIG. 4 is a schematic that illustrates the circuit of FIG. 3 in which certain switches are open and certain switches are closed to disconnect the compensation capacitors from the remainder of the circuit and to cross-connect the compensation capacitors so as to share charge between them, according to some embodiments of the present invention.

FIG. 4 illustrates the circuit 300 of FIG. 3 in which switches 310, 320, 350, and 360 are open and switches 330 and 340 are closed to disconnect the compensation capacitors $C_P$ and $C_N$ from the remainder of the circuit 300 and to cross-connect the compensation capacitors $C_P$ and $C_N$ so as to share charge between them. As shown by the equations below, by cross-connecting the compensation capacitors $C_P$ and $C_N$, the voltage level VOUT at the output node of the circuit can be reset to about one-half VDD. The total charge on compensation capacitor $C_P$ is given by Equation 1:

$$Q_P=C_P(VP-VOUT) \qquad \text{EQ. 1}$$

Similarly, the total charge on compensation capacitor $C_N$ is given by Equation 2:

$$Q_N=C_N(VOUT-VN) \qquad \text{EQ. 2}$$

The total charge is given by Equation 3:

$$Q_T=Q_N+Q_P \qquad \text{EQ. 3}$$

Assuming $C_P$ is approximately equal to $C_N$, then Equation 3 can be rewritten as Equation 4:

$$Q_T=C_P(VP-VOUT)+C_N(VOUT-VN)=C_P(VP-VN) \qquad \text{EQ. 4}$$

When the two compensation capacitors $C_P$ and $C_N$ are connected in parallel, the voltage drop across the two compensation capacitors $C_P$ and $C_N$ is given by Equation 5:

$$V_T=Q_T/2C_P \qquad \text{EQ. 5}$$

Substituting Equation 4 into Equation 5 results in Equation 6:

$$V_T=(VP-VN)/2 \qquad \text{EQ. 6}$$

When the two compensation capacitors $C_P$ and $C_N$ are connected in parallel, the voltage VOUT is given by Equation 7:

$$VOUT=VP-V_T=VP-(VP-VN)/2\sim=VDD/2 \qquad \text{EQ. 7}$$

Figure 5A:
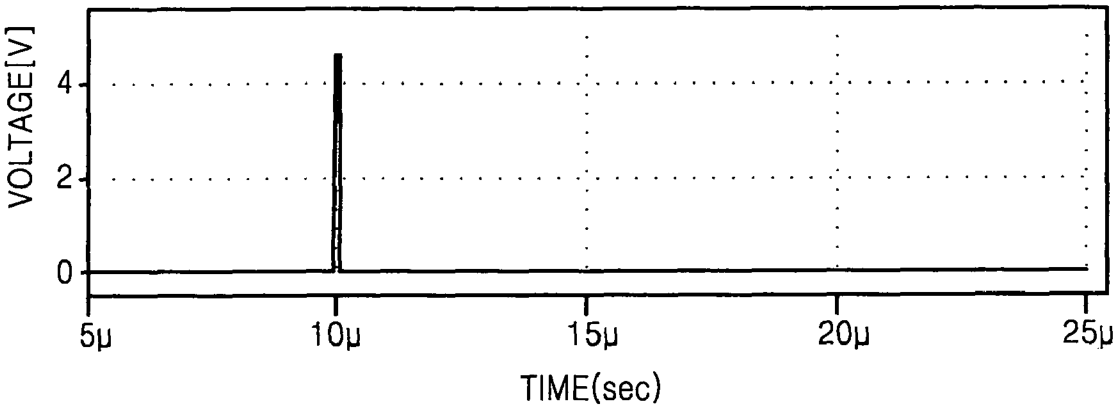
FIGS. 5A and 5B are waveform diagrams that illustrate the control signal FR_ON of FIGS. 3 and 4 and the output voltage VOUT of FIGS. 3 and 4 that is generated in response thereto, respectively.
Figure 5B:
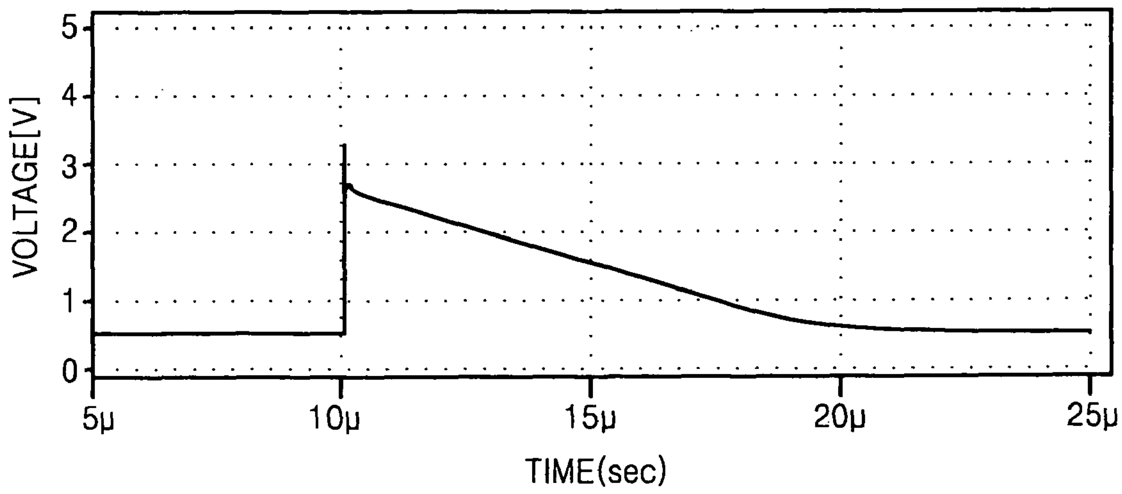

FIGS. 5A and 5B are waveform diagrams that illustrate the control signal FR_ON and the output voltage VOUT that is generated in response thereto, respectively. At a time of approximately 10 μsec, the control signal FR_ON is pulsed, which opens switches 310, 320, 350, and 360 and closes switches 330 and 340 so as to disconnect the compensation capacitors $C_P$ and $C_N$ from the remainder of the circuit 300 and to cross-connect the compensation capacitors $C_P$ and $C_N$ in parallel so as to share charge between them. As shown in FIG. 5B, the output voltage VOUT is driven to a voltage of about VDD/2 in response to the pulse of the control signal FR_ON. The voltage VOUT then decreases over time based on the time constant associated with the circuit as the charge dissipates from the compensation capacitors $C_P$ and $C_N$.

Figure 6A:
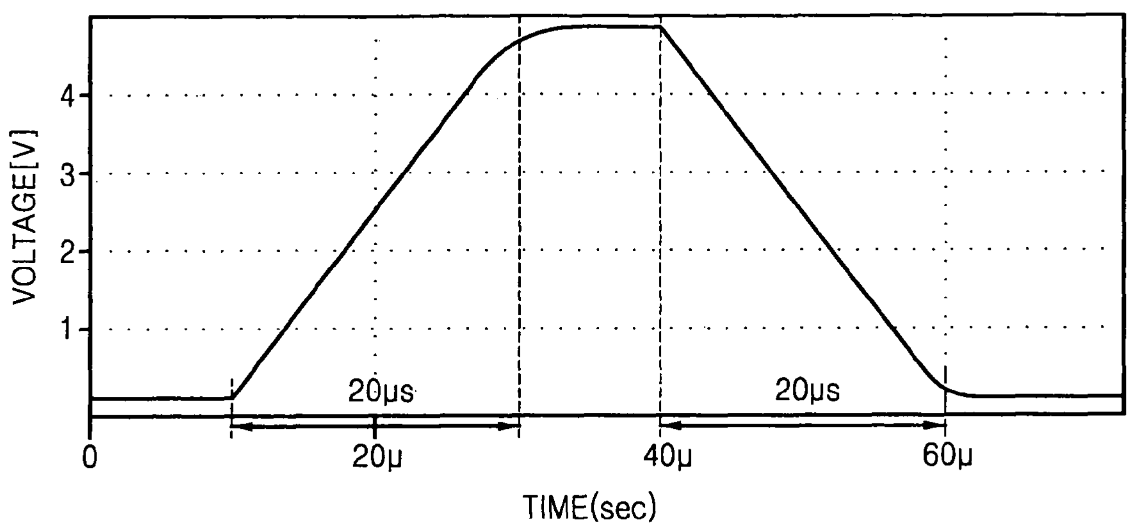
FIG. 6A(PRIOR ART)
FIGS. 6A and 6B are waveform diagrams that illustrate the output voltage for a conventional source amplifier driver circuit and the circuit of FIG. 3, respectively.
Figure 6B:
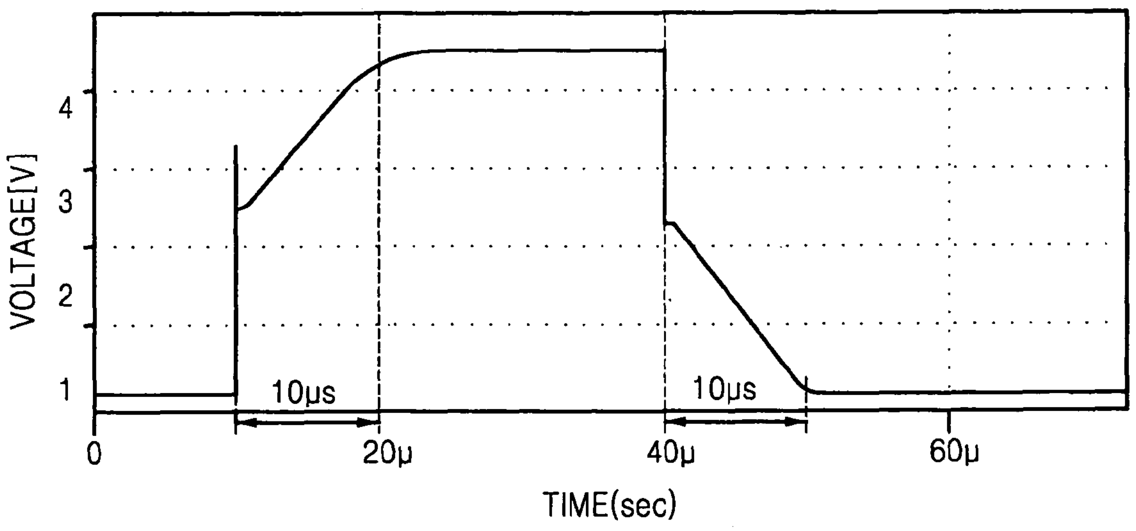

FIGS. 6A and 6B are waveform diagrams that illustrate the output voltage (VOUT) for a conventional source amplifier driver circuit and the circuit 300 of FIG. 3, respectively. Referring to FIG. 6A, the conventional source amplifier driver circuit drives the output voltage VOUT from a common reference voltage level to about a power supply voltage level in approximately 20 μsec. By contrast, the circuit 300 of FIG. 3 drives the output voltage VOUT to approximately VDD/2 almost immediately at the 10 μsec time point in response to a pulse of the control signal FR_ON as shown in FIG. 6B. It then takes approximately 10 μsec for the voltage VOUT to reach a level about equal to the power supply voltage level. Thus, the circuit 300, according to some embodiments of the present invention, may drive an output voltage to a level about equal to a power supply voltage in approximately half the time that a conventional source driver amplifier circuit requires. Similarly, at the 40 μsec time point, the conventional source amplifier driver circuit drives the output voltage VOUT from about a power supply voltage level to a common reference voltage level, e.g., ground. The voltage VOUT reaches the common reference voltage level in approximately 20 μsec as shown in FIG. 6A. By contrast, the circuit 300 of FIG. 3 drives the output voltage VOUT to approximately VDD/2 almost immediately at the 40 μsec time point in response to a pulse of the control signal FR_ON as shown in FIG. 6B. It then takes approximately 10 μsec for the voltage VOUT to reach a level about equal to the common reference voltage level, e.g., ground.

Advantageously, according to some embodiments of the present invention, the output of an amplifier circuit can be driven to about half-VDD relatively quickly through charge-sharing before the amplifier is driven to a new voltage. The amplifier circuit may be used, for example, to drive a thin film transistor (TFT) panel at a higher frequency, which may be particularly useful in mobile terminal application. Moreover, according to some embodiments of the present invention, the output of the amplifier circuit can be driven to about half-VDD through charge sharing instead of by current, which allows the amplifier's power consumption to be reduced.

Returning to FIG. 3, the circuit 300 further includes an input differential amplifier circuit that comprises an NMOS differential amplifier circuit 365 and a PMOS differential amplifier circuit 370 that are connected to an NMOS current mirror circuit 375 and a PMOS current mirror circuit 380, respectively. The switches 310, 320, 330, 340, 350, and 360 along with the compensation capacitors $C_P$ and $C_N$ may be viewed as comprising a reset control circuit 385 that is responsive to the control signal FR_ON. The reset control circuit 385 couples the current mirror circuits 375 and 380 to an output stage circuit 390. A control circuit 392 is used to control the current through the output stage circuit 390 so that the output branch circuit 390 operates as a class AB amplifier circuit. A bias circuit 395, which may be a floating current source circuit as shown in FIG. 3, couples the NMOS current mirror circuit 375 to the PMOS current mirror circuit 380. For use as a source driver amplifier circuit, the circuit 300 provides unit gain. Accordingly, the voltage VOUT at the output node is fed back to the input differential amplifier circuit 365, 370. During a reset of the output voltage VOUT to about half-VDD, however, if the output node of the output stage circuit 390 remains connected to the input differential amplifier circuit 365, 370, then the circuit 300 may enter an oscillation state, which may draw additional current. Thus, the reset control circuit 385 uses switches 310, 320, 350, and 360 to completely disconnect the output stage circuit 390 from the remainder of the circuit 300 during a reset of the output voltage VOUT to about half-VDD.

Figure 7:
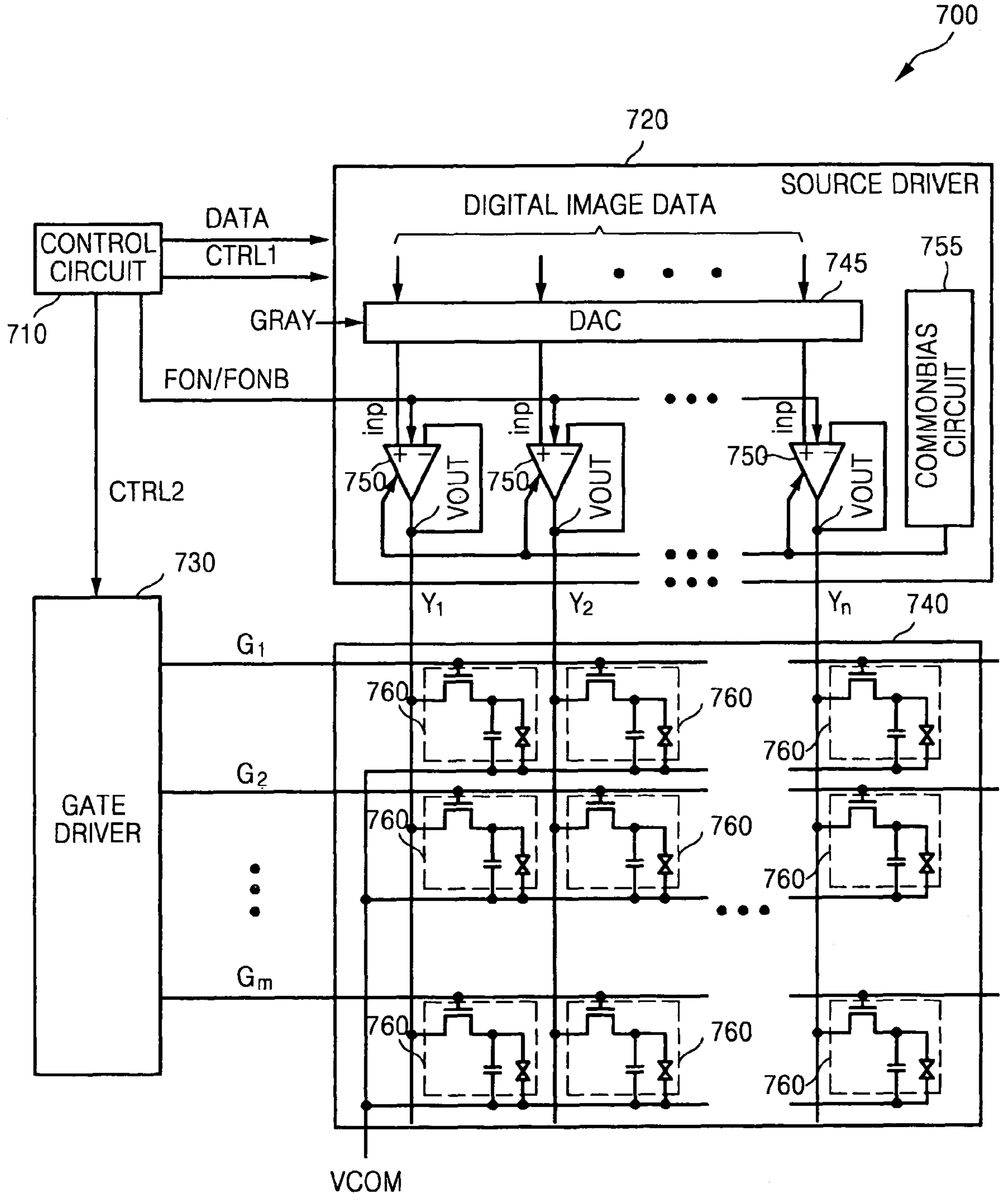
FIG. 7 is a schematic that illustrates a driver system for a display, such as a Thin Film Transistor-Liquid Crystal Display (TFT-LCD) display, in accordance with some embodiments of the present invention.

FIG. 7 illustrates a driver system 700 for a display, such as a Thin Film Transistor-Liquid Crystal Display (TFT-LCD) display, in accordance with some embodiments of the present invention. The driver system 700 includes a control circuit 710, an image data driver circuit 720, a gate driver circuit 730, and a TFT-LCD panel 740 that are configured as shown. The image data driver circuit 720 includes a digital-to-analog converter (DAC) 745 that is coupled to a plurality of amplifier circuits 750. Each of the amplifier circuits may be embodied as the circuit 300 of FIG. 3 in accordance with some embodiments of the present invention. A bias circuit 755 may be used to bias the amplifier circuits 750. The TFT-LCD panel 740 includes a plurality of liquid crystal capacitor circuits 760 that are responsive to voltages generated at the outputs of the plurality of amplifier circuits 750.

Exemplary operations of the driver system 700, according to some embodiments of the present invention, will now be described. The control circuit 710 may be configured to communicate with a microcontroller, for example, to obtain RGB image data to be displayed on the display panel 740. The control circuit 710 communicates the RGB image data to the image data driver circuit 720. The image data driver circuit 720 includes a DAC 745 that generates gray scale analog voltages responsive to the digital image data and a control signal GRAY. The gray scale analog voltages output from the DAC 745 are provided as inputs to the amplifier circuits 750, each of which may be embodied as the circuit 300 of FIG. 3. The amplifier circuits 750 are used to drive source lines Y1 through Yn corresponding to one dimension of an array of pixels provided by the display panel 740 to voltage levels between a power voltage level (e.g., VDD) and a common reference voltage level (e.g., ground) responsive to the output gray scale voltages of the DAC 745, the reset control signal FON generated by the control circuit 710, and the control signal CTRL1. The reset control signal FON may correspond to the reset control signal FR_ON of FIG. 3.

The display panel 740 includes an array of liquid crystal capacitor circuits 760 respectively corresponding to individual pixels. The gate driver circuit 730 selectively scans gate lines G1 through Gm of the array of liquid crystal capacitor circuits 760 or pixels along one dimension of the array in response to a control signal CTRL2 generated by the control circuit 710. In concert with the scan by the gate driver circuit 730, the amplifiers 750 drive the sources lines Y1 through Yn along a second dimension of the array with gray scale voltage levels to display an image on the display panel 740. In more detail, when the gate driver 730 turns on a switch of a liquid crystal capacitor circuit 760, then an amplifier circuit 750 can apply a gray scale voltage to a liquid crystal capacitor that is connected to the switch.

As discussed above with respect to FIGS. 6A and 6B, the circuit 300 of FIG. 3, which can be used to implement each of the amplifier circuits 750, can operate at approximately twice the frequency of a conventional amplifier circuit. This may allow the display panel 740 to include a larger array of liquid crystal capacitor circuits 760 or pixels to provide increased resolution without consuming additional current.

Figure 8:
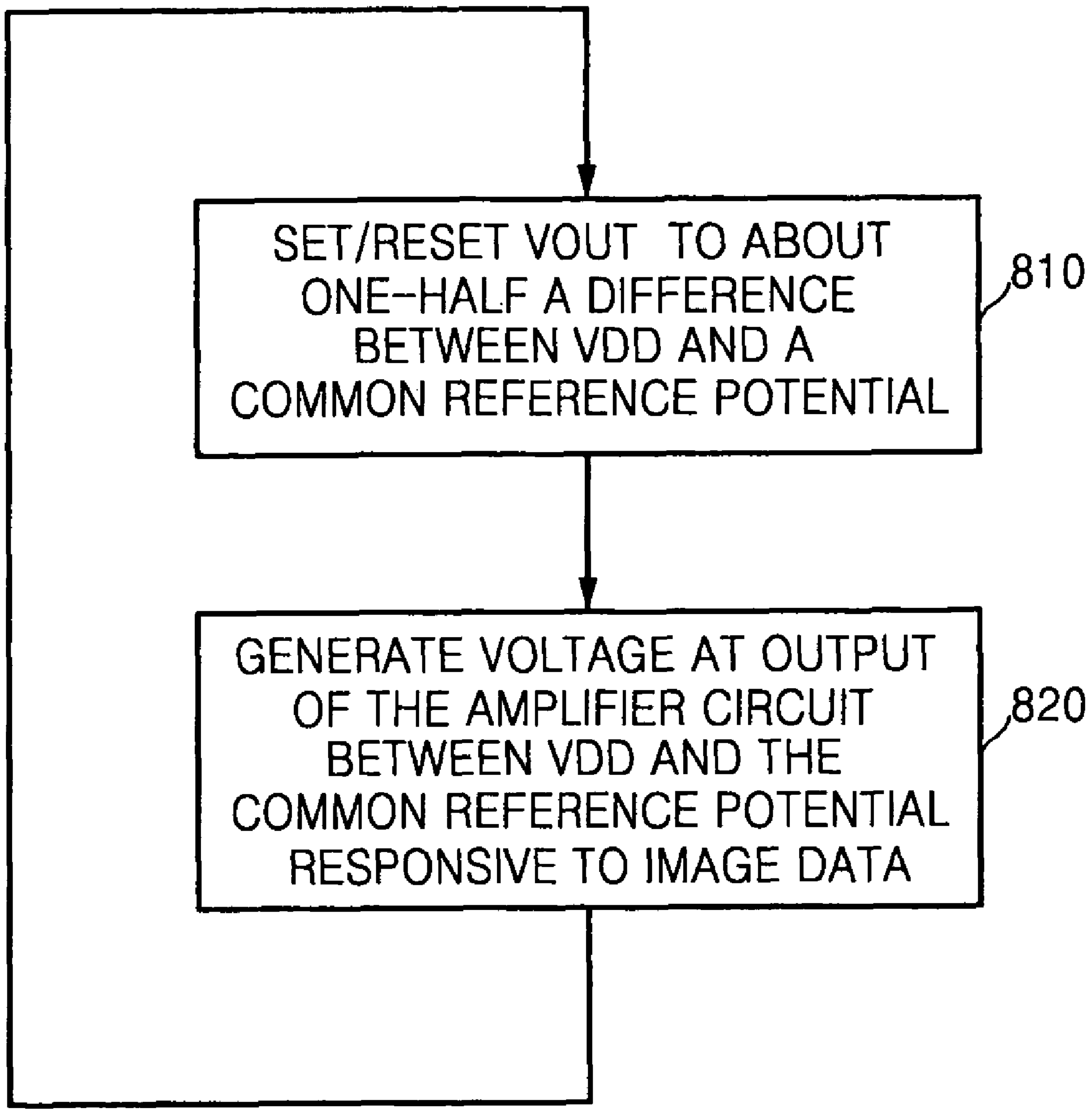
FIG. 8 is a flowchart that illustrates operations for operating a source driver amplifier circuit according to some embodiments of the present invention.

Exemplary operations for operating a source driver amplifier circuit, such as the circuit 300 of FIG. 3, according to some embodiments of the present invention, will now be described with reference to FIG. 8. Operations begin at block 810 where the circuit 300 sets/resets an output voltage VOUT at a voltage level of about one-half of a difference between a power voltage level (VDD) and a common reference voltage level (e.g., ground). At block 820, a voltage level between the power voltage level and the common reference voltage level is generated at the output of the amplifier circuit responsive to image data. In this way, the circuit 300 may be used to drive a TFT-LCD panel, such as the display panel 740 of FIG. 7 at higher frequencies than may be possible using the source driver amplifier circuit of FIG. 1.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

That which is claimed:

1. A circuit, comprising:

an amplifier circuit that is configured to generate voltage levels between a power voltage level and a common reference voltage level at an output thereof responsive to image data, the amplifier circuit comprising first and second compensation capacitors connected in series between a power node that provides the power voltage level and a common reference node that provides the common reference voltage level; and a reset control circuit that is configured to reset the voltage level at the output of the amplifier circuit to about one-half of a difference between the power voltage level and the common reference voltage level and to disconnect the first and second compensation capacitors from the power node and the common reference node and to connect the first and second compensation capacitors in parallel responsive to a control signal.

2. The circuit of claim 1, wherein the amplifier circuit further comprises;

an output stage circuit having an output node;

wherein the first compensation capacitor is connected between the output node and the power node and the second compensation capacitor is connected between the output node and the common reference node.

3. The circuit of claim 2, wherein the output stage circuit is a class AB amplifier output stage circuit.

4. The circuit of claim 2, wherein the amplifier circuit further comprises:

a first current mirror circuit that is connected between the power node and the first compensation capacitor; and a second current mirror circuit that is connected between the common reference node and the second compensation capacitor.

5. The circuit of claim 4, wherein the reset control circuit comprises:

a first switch that is configured to disconnect the first current mirror circuit from the first compensation capacitor responsive to the control signal;

a second switch that is configured to disconnect the second current mirror circuit from the second compensation capacitor responsive to the control signal;

a third switch that is configured to disconnect the output node of the output stage circuit from the first compensation capacitor responsive to the control signal;

a fourth switch that is configured to disconnect the output node of the output stage circuit from the second compensation capacitor responsive to the control signal; and a pair of cross-connect switches that are configured to connect the first and second compensation capacitors in parallel responsive to the control signal.

6. The circuit of claim 4, wherein the amplifier circuit further comprises:

a differential amplifier circuit that is connected to the first and second current mirror circuits and is responsive to a differential input voltage;

wherein the differential amplifier circuit has an input terminal that is connected to the output node of the output stage circuit; and wherein the reset control circuit is further configured to disconnect the output node of the output stage circuit from the input terminal of the differential amplifier circuit responsive to the control signal.

7. A driver system for an electronic display, comprising:

a display panel comprising an array of pixels; and an image data driver circuit that comprises:

an amplifier circuit that is configured to drive the display panel with voltage levels between a power voltage level and a common reference voltage level at outputs thereof responsive to image data; and a reset control circuit that is configured to reset the voltage levels at the outputs of the amplifier circuit to about one-half of a difference between the power voltage level and the common reference voltage level;

wherein the amplifier circuit comprises a plurality of amplifier circuits, the amplifier circuits being respectively associated with pixels along a first dimension of the array, each of the amplifier circuits comprising:

first and second compensation capacitors connected in series between a power node that provides the power voltage level and a common reference node that provides the common reference voltage level; and wherein the reset control circuit is further configured to disconnect the first and second compensation capacitors from the power node and the common reference node and to connect the first and second compensation capacitors in parallel responsive to a control signal.

8. The driver system of claim 7, further comprising:

a control circuit that is configured to generate the control signal, and a gate driver control signal in concert with one another and to output image data; and a gate driver circuit that is connected to the display panel and is configured to selectively scan the pixels along a second dimension of the array responsive to the gate driver control signal.

9. The driver system of claim 7, wherein each of the amplifier circuits further comprises:

an output stage circuit having an output node;

wherein the first compensation capacitor is connected between the output node and the power node and the second compensation capacitor is connected between the output node and the common reference node.

10. The driver system of claim 9, wherein the output stage circuit is a class AB amplifier output stage circuit.

11. The driver system of claim 9, wherein each of the amplifier circuits further comprises:

a first current mirror circuit that is connected between the power node and the first compensation capacitor; and a second current mirror circuit that is connected between the common reference node and the second compensation capacitor.

12. The driver system of claim 11, wherein the reset control circuit comprises:

a first switch that is configured to disconnect the first current mirror circuit from the first compensation capacitor responsive to the control signal;

a second switch that is configured to disconnect the second current mirror circuit from the second compensation capacitor responsive to the control signal;

a third switch that is configured to disconnect the output node of the output stage circuit from the first compensation capacitor responsive to the control signal;

a fourth switch that is configured to disconnect the output node of the output stage circuit from the second compensation capacitor responsive to the control signal; and a pair of cross-connect switches that are configured to connect the first and second compensation capacitors in parallel responsive to a control signal.

13. The driver system of claim 11, wherein each of the amplifier circuits further comprises:

a differential amplifier circuit that is connected to the first and second current mirror circuits and is responsive to a differential input voltage;

wherein the differential amplifier circuit has an input terminal that is connected to the output node of the output stage circuit;

wherein the reset control circuit is further configured to disconnect the output node of the output stage circuit from the input terminal of the differential amplifier circuit responsive to the control signal.

14. A method of operating an amplifier circuit, comprising:

setting a voltage level at an output of an amplifier circuit to about one-half of a difference between a power voltage level and a common reference voltage level; then generating a voltage level between the power voltage level and the common reference voltage level at the output of the amplifier circuit responsive to image data;

wherein setting the voltage level comprises:

disconnecting the first and second compensation capacitors from the power node and the common reference node responsive to a control signal; and connecting the first and second compensation capacitors in parallel responsive to the control signal; and wherein generating the voltage level comprises:

connecting first and second compensation capacitors in series between a power node that provides the power voltage level and a common reference node that provides the common reference voltage level.

15. The method of claim 14, further comprising:

providing an output stage circuit having an output node;

wherein connecting the first and second compensation capacitors in series comprises connecting the first compensation capacitor between the output node and the power node and connecting the second compensation capacitor between the output node and the common reference node.

16. The method of claim 15, wherein the output stage circuit is a class AB amplifier output stage circuit.

17. The method of claim 15, wherein the method further comprises:

providing a first current mirror circuit that is connected between the power node and the first compensation capacitor; and providing a second current mirror circuit that is connected between the common reference node and the second compensation capacitor.

18. The method of claim 17, wherein disconnecting the first and second compensation capacitors comprises:

disconnecting the first current mirror circuit from the first compensation capacitor responsive to the control signal;

disconnecting the second current mirror circuit from the second compensation capacitor responsive to the control signal;

disconnecting the output node of the output stage circuit from the first compensation capacitor responsive to the control signal;

disconnecting the output node of the output stage circuit from the second compensation capacitor responsive to the control signal; and wherein connecting the first and second compensation capacitors in parallel comprises:

operating a pair of cross-connect switches that are configured to connect the first and second compensation capacitors in parallel responsive to the control signal.

19. The method of claim 17, further comprising:

providing a differential amplifier circuit that is connected to the first and second current mirror circuits and is responsive to a differential input voltage, the differential amplifier circuit having an input terminal that is connected to the output node of the output stage circuit; and disconnecting the output node of the output stage circuit from the input terminal of the differential amplifier circuit responsive to the control signal.

20. A method of operating a driver system for an electronic display, comprising:

providing a display panel comprising an array of pixels;

setting voltage levels at outputs of an amplifier circuit that is used to drive the display panel to about one-half a difference between a power voltage level and a common reference voltage level; then driving the display panel with voltage levels at outputs of the amplifier circuit between the power voltage level and the common reference voltage level responsive to image data;

wherein the amplifier circuit comprises a plurality of amplifier circuits, the amplifier circuits being respectively associated with pixels along a first dimension of the array, and wherein setting the voltage levels comprises in each of the amplifier circuits:

disconnecting the first and second compensation capacitors from the power node and the common reference node responsive to a control signal; and connecting the first and second compensation capacitors in parallel responsive to the control signal; and wherein driving the display panel comprises in each of the amplifier circuits:

connecting first and second compensation capacitors in series between a power node and a common reference node.

21. The method of claim 20, further comprising in each of the amplifier circuits:

providing an output stage circuit having an output node;

wherein connecting the first and second compensation capacitors in series comprises connecting the first compensation capacitor between the output node and the power node and connecting the second compensation capacitor between the output node and the common reference node.

22. The method of claim 21, wherein the output stage circuit is a class AB amplifier output stage circuit.

23. The method of claim 21, wherein the method further comprises in each of the amplifier circuits:

providing a first current mirror circuit that is connected between the power node and the first compensation capacitor; and providing a second current mirror circuit that is connected between the common reference node and the second compensation capacitor.

24. The method of claim 23, wherein disconnecting the first and second compensation capacitors comprises:

disconnecting the first current mirror circuit from the first compensation capacitor responsive to the control signal;

disconnecting the second current mirror circuit from the second compensation capacitor responsive to the control signal;

disconnecting the output node of the output stage circuit from the first compensation capacitor responsive to the control signal;

disconnecting the output node of the output stage circuit from the second compensation capacitor responsive to the control signal; and wherein connecting the first and second compensation capacitors in parallel comprises:

operating a pair of cross-connect switches that are configured to connect the first and second compensation capacitors in parallel responsive to the control signal.

25. The method of claim 23, further comprising in each of the amplifier circuits:

providing a differential amplifier circuit that is connected to the first and second current mirror circuits and is responsive to a differential input voltage, the differential amplifier circuit having an input terminal that is connected to the output node of the output stage circuit; and disconnecting the output node of the output stage circuit from the input terminal of the differential amplifier circuit responsive to the control signal.

* * * * *